(12) United States Patent
Low et al.

(10) Patent No.: US 7,332,801 B2
(45) Date of Patent: Feb. 19, 2008

(54) ELECTRONIC DEVICE

(75) Inventors: Ai Ling Low, Kedah (MY); Dejen Eshete, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/955,233

(22) Filed: Sep. 30, 2004

(65) Prior Publication Data

US 2006/0065963 A1 Mar. 30, 2006

(51) Int. Cl.
*H01L 29/40* (2006.01)

(52) U.S. Cl. .................... 257/686; 257/737; 257/777; 257/778; 257/E23.021; 257/E23.069

(58) Field of Classification Search ........... 257/685, 257/686, 737, 738, 778, 781, 784, E23.023, 257/777, E23.021, E23.062, E23.069
See application file for complete search history.

(56) References Cited

U.S. PATENT DOCUMENTS

| | | | | |
|---|---|---|---|---|
| 5,952,725 A | * | 9/1999 | Ball | 257/777 |
| 6,841,881 B2 | * | 1/2005 | Katagiri et al. | 257/777 |
| 6,992,396 B2 | * | 1/2006 | Arai et al. | 257/777 |
| 2001/0040285 A1 | * | 11/2001 | Ishio et al. | 257/690 |
| 2002/0151103 A1 | * | 10/2002 | Nakamura et al. | 438/106 |
| 2002/0195696 A1 | * | 12/2002 | Yoneda | 257/678 |
| 2003/0045030 A1 | * | 3/2003 | Hayashida et al. | 438/110 |
| 2003/0189259 A1 | * | 10/2003 | Kurita et al. | 257/777 |
| 2004/0089936 A1 | * | 5/2004 | Shizuno | 257/686 |
| 2004/0140552 A1 | * | 7/2004 | Kuroda et al. | 257/700 |
| 2004/0164385 A1 | * | 8/2004 | Kado et al. | 257/678 |
| 2004/0212088 A1 | * | 10/2004 | Chen et al. | 257/738 |
| 2004/0222509 A1 | * | 11/2004 | Ogata | 257/686 |
| 2006/0065958 A1 | * | 3/2006 | Tsao et al. | 257/678 |

* cited by examiner

*Primary Examiner*—Minh-Loan Tran

(57) ABSTRACT

An electronic device includes a first die that includes wires for bonding, a second die that includes an array of balls for bonding, and a substrate. The substrate includes bond sites for wires from the first die, and bond sites for the array of balls from the second die. The wires of first die are coupled to the bond sites for wires of the substrate. The balls of the second die are coupled to the bond sites for the array of balls of the substrate.

21 Claims, 9 Drawing Sheets

ELECTRONIC DEVICE

BACKGROUND INFORMATION

Integrated circuits have been manufactured for many years. Manufacturing integrated circuits involves integrating various active and passive circuit elements into a piece of semiconductor material, referred to as a die. The die is attached to a package substrate to form a package. Currently, the size of packages is trending to smaller sizes due to application and cost. In some instances, a number of dies are attached to a single package substrate. When a number of dies are attached to a single substrate, the dies are stacked.

There are many categories of dies. Two of the many categories include flip chip ball grid array dies (FCBGA) and plastic ball grid array dies (PBGA). FCBGA dies include a series of solder balls that attach directly to corresponding pads on a substrate. PBGA dies include wires that are wire bonded to pads on a substrate. The solder balls form a reliable connection to a first type of pad, while the wires attach to form a reliable connection to a second and very different type of pad. Therefore, when a stack of dies are formed, typically one category of dies is typically used in the stack. Using two types of dies stacked in a single package would compromise the reliability of the finished package since one of either the solder balls or the wires would have a less than reliable bond with a package substrate. Typically, two substrates would be used rather than compromise reliability. This requires additional packages on a printed circuit board in an electronic device.

BRIEF DESCRIPTION OF THE DRAWINGS

Embodiments of the invention are pointed out with particularity in the appended claims. However, a more complete understanding of the inventive subject matter may be derived by referring to the detailed description when considered in connection with the figures, wherein like reference numbers refer to similar items throughout the figures, and:

The description set out herein illustrates various embodiments of the invention, and such description is not intended to be construed as limiting in any manner.

DETAILED DESCRIPTION

In the following detailed description of the preferred embodiments, reference is made to the accompanying drawings that form a part hereof, and in which are shown by way of illustration specific embodiments in which the inventive subject matter can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of the inventive subject matter. The following detailed description, therefore, is not to be taken in a limiting sense, and the scope of various embodiments of the invention is defined only by the appended claims, along with the full range of equivalents to which such claims are entitled.

Figure 1:
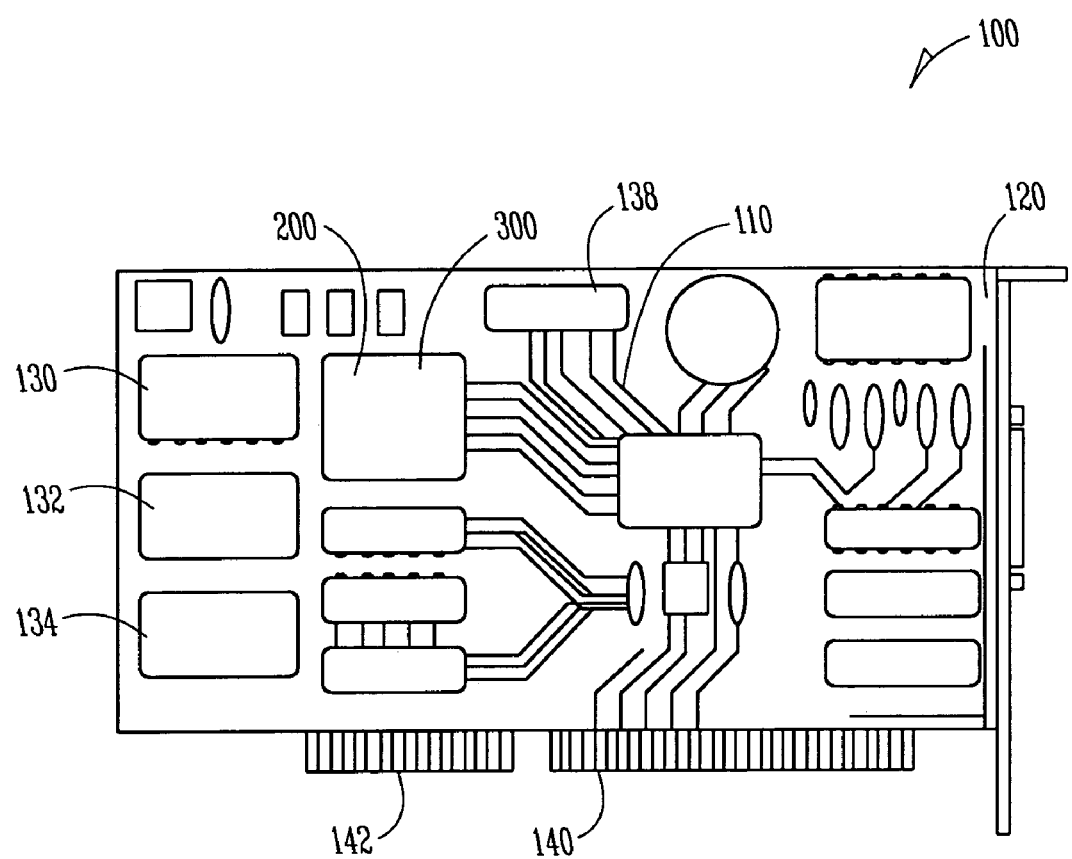
FIG. 1 is a top view of a printed circuit board having a package that is formed according to an example embodiment.

FIG. 1 is a top view of a printed circuit board 100 formed according to an example embodiment. The printed circuit board 100 includes an electrical device or component 300 having a package substrate 200 formed according to an embodiment of the invention. The printed circuit board ("PCB") 100 is a multi-layer plastic board that includes patterns of printed circuits on one or more layers of insulated material. The patterns of conductors correspond to the wiring of an electronic circuit formed on one or more of the layers of the printed circuit board 100. The printed circuit board 100 also includes electrical traces 110. The electrical traces 110 can be found on an exterior surface 120 of the printed circuit board 100, and also can be found on the various layers within the printed circuit board 100. Printed circuit boards also include through holes (not shown in FIG. 1) which are used to interconnect traces on various layers of the printed circuit board 100. The printed circuit board 100 can also include planes of metallized materials such as ground planes, power planes, or voltage reference planes (not shown in FIG. 1).

The printed circuit board 100 is also populated with various components 130, 132, 134, 138, 300. The components 130, 132, 134, 138, 300 can be either discrete components, or semiconductor chips which include thousands of transistors. The components 130, 132, 134, 138, 300 can use any number of technologies to connect to the exterior surface 120 of the printed circuit board 100. For example, pins may be inserted into plated through holes, or pins may be extended through the printed circuit board 100. An alternative technology is surface mount technology, where an electrical device, such as component 300, mounts to an array of pads on the exterior surface 120 of the printed circuit board 100. For example, electrical device or 300 could be a ball grid array package or device that has an array of balls or bumps that interact or are connected to a corresponding array of pads on the exterior surface 120 of the printed circuit board 100. The electrical device or component 300 includes a package substrate 200 and a die 310 (shown in FIG. 3). The package substrate 200 is formed according to an embodiment of this invention. The die is electrically coupled to the package substrate 200 to form an electrical device or component 300 that can be attached to the printed circuit board 100.

The printed circuit board 100 can also include electrical traces 110 for making external connections to other electrical or electronic devices. In an embodiment of the invention, the electrical device or component 300 is a central processing chip or microprocessor, that can be used as a controller or for any other function. Although the printed circuit board 100 shown is a daughter board, the printed circuit board 100 could also be a motherboard, and the component or electrical device could be the main processing unit for a computer. In some computing environments, multiple main processing units can be used.

As shown in FIG. 1, the printed circuit board 100 includes a first edge connector 140 and a second edge connector 142. As shown in FIG. 1 there are external traces, such as electrical trace 110, on the exterior surface 120 of the printed circuit board 100, that connect to certain of the outputs associated with the first edge connector 140. Other traces that connect with the first edge connector 140, second edge connector 142 will have traces internal to the printed circuit board 100. The circuit board can be any type of specialized circuit board, including a motherboard, a daughterboard, a video card, a sound card, a modem card, a network interface card, a controller card, or the like.

Figure 2:
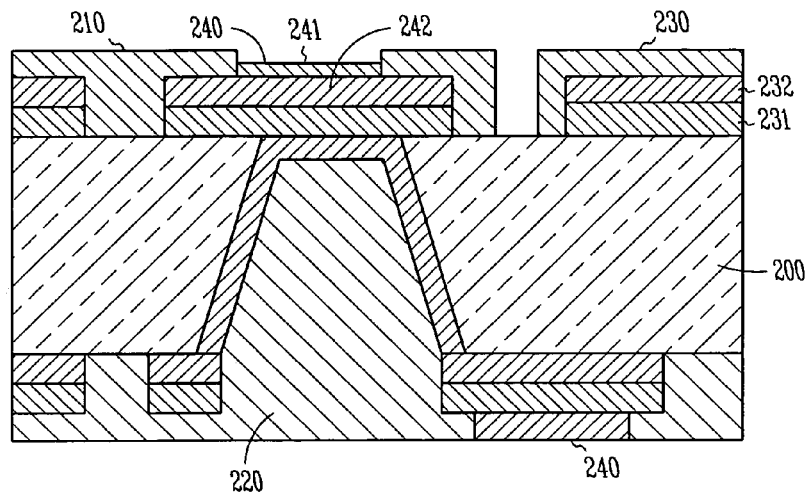
FIG. 2 illustrates a side view of an package substrate, according to an example embodiment.

FIG. 2 illustrates a side view of a package substrate 200, according to an example embodiment. The package substrate or substrate 200 includes a first major surface 210, a second major surface 220, a wire bond pad 230 adapted to receive a wire, and a ball bond pad 240 adapted to receive a ball. The wire bond pad 230 is associated with one of the first major surface 210 and the second major surface 220. The ball pad 240 is associated with at least one of the first major surface 210 and the second major surface 220. In one embodiment, the wire bond pad 230 and the ball bond pad 240 are on the same major surface, such as the first major surface 210 of the package substrate 200. The wire bond pad 230 includes a plated area having plating thickness sufficient for receiving a wire. The ball bond pad 240 includes a plated area having a plating thickness less than the plating thickness of the wire bond pad 230. In some embodiments, the wire bond pad 230 includes a layer of nickel and a layer of gold. In some embodiments, the ball bond pad 240 includes a layer of nickel and a layer of gold.

Figure 3:
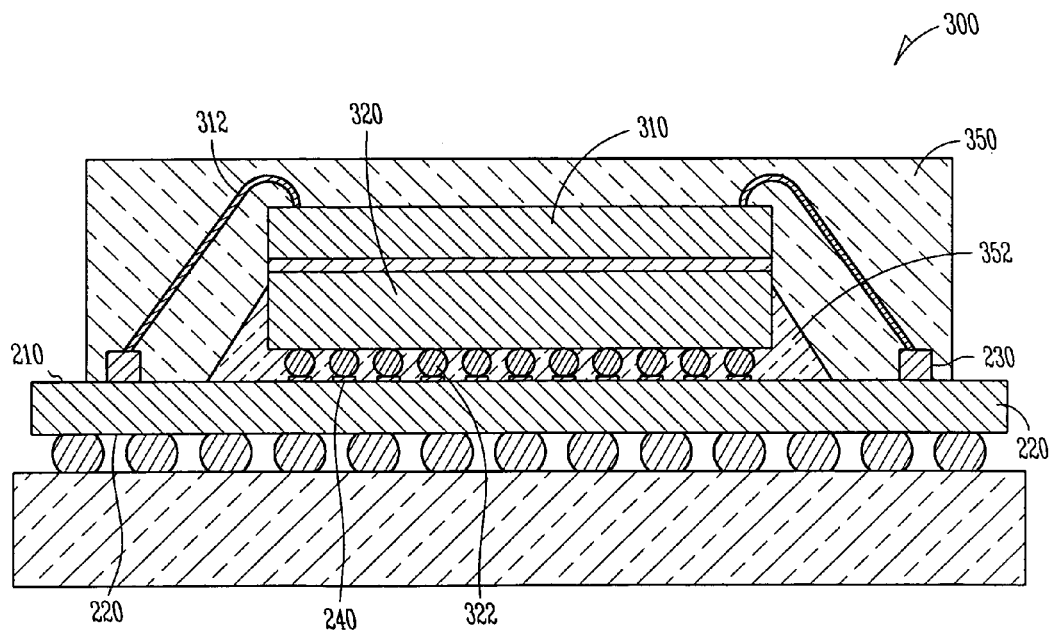
FIG. 3 illustrates a cross-sectional view of a finished package including a substrate with wire bond sites and ball bond sites, according to an example embodiment.
Figure 4:
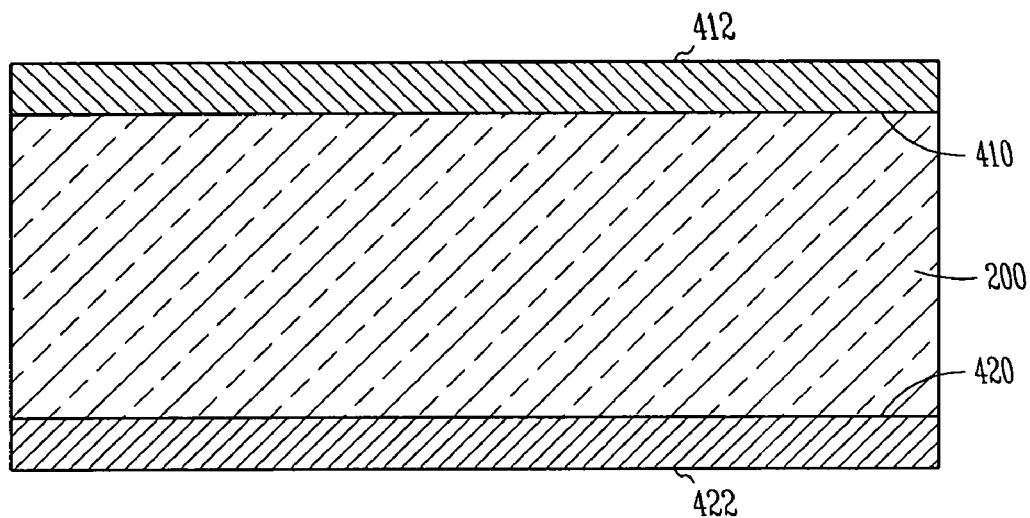
FIG. 4 illustrates a cross-sectional view of a substrate with copper foil, according to an example embodiment.

FIG. 3 illustrates a cross-sectional view of a finished package or electronic device 300 including a substrate with wire bond sites and ball bond sites, according to an example embodiment. The finished package or electronic device or component 300 can also be called an electronic component or simply a component. The electronic device 300 includes a first die 310 that includes wires 312 for bonding, a second die 320 that includes an array of balls 322 for bonding, and a substrate 200. The substrate 200 includes wire bond pad 230 for wires from the first die 310, and ball bond pad 240 for the array of balls from the second die 320. The wires 312 of first die 310 are coupled to the wire bond pad 230 for wires of the substrate 200. The array of balls 322 of the second die 320 are coupled to the ball bond pad 240 for the array of balls of the substrate 200. In some example embodiments of the electronic device or component 300, the first die 310 is stacked on the second die 320. The second die 320, in some embodiments, is positioned closer to the substrate 200 than the first die 310. In some embodiments, the second die 320 is a flip chip ball grid array and the first die 310 is a wire bond die. The electrical device component 300 also includes an encapsulating material 350 substantially surrounding the first die 310 and the second die 320. In other embodiments, the encapsulating material 350 includes a mold material positioned around the second die 320 and the first die 310. The encapsulating material 350, in some embodiments, includes an underfill material 352 positioned between the substrate 200 and the second die 320.

Referring to both FIG. 1 and FIG. 3, an electronic system includes a printed circuit board 100, and an electrical device or component 300 coupled to the printed circuit board 100. The electrical device or component 300 further includes a first die 310 that includes wires 312 for bonding, a second die 320 that includes an array of balls 322 for bonding, and a package substrate 200. The package substrate 200 also includes wire bond pad 230 for wires 312 from the first die 310, and bond sites 240 for the array of balls 322 from the second die 320. The wires 312 of first die 310 are coupled to the bond sites 230 for wires of the substrate 200. The array of balls 322 of the second die 320 are coupled to the wire bond sites 240 for the array of balls 322 of the substrate 200. As shown in FIG. 3, the first major surface 210 of the substrate includes at least one wire bond site 230 and includes at least one ball bond pad 240. The second major surface 220 includes at least one ball bond site. In some embodiments, the electronic system also includes an electronic component, such as component 130, 132, 134, 138 attached to the printed circuit board 100. In some embodiments, the circuit board 100 is a printed circuit board. In some embodiments, the second die 320 of the electronic device 300 is a flip chip ball grid array and the first die 310 of the electronic device 300 is a plastic ball grid array. The electronic device 300 further includes an encapsulating compound 350 substantially surrounding the first die 310 and the second die 320.

Now referring to FIGS. 4-13, a method for fabricating a package or electronic device 300 according to an embodiment of the invention will now be discussed. FIGS. 4-13 illustrate various cross-sectional views of the substrate at various points during the process of forming the electronic device 300.

The substrate 200 includes a first major surface 410 and a second major surface 420. Positioned on the first major surface 410 is a layer of copper foil 412, and positioned or placed on the second major surface 420 is a layer of copper foil 422.

Figure 5:
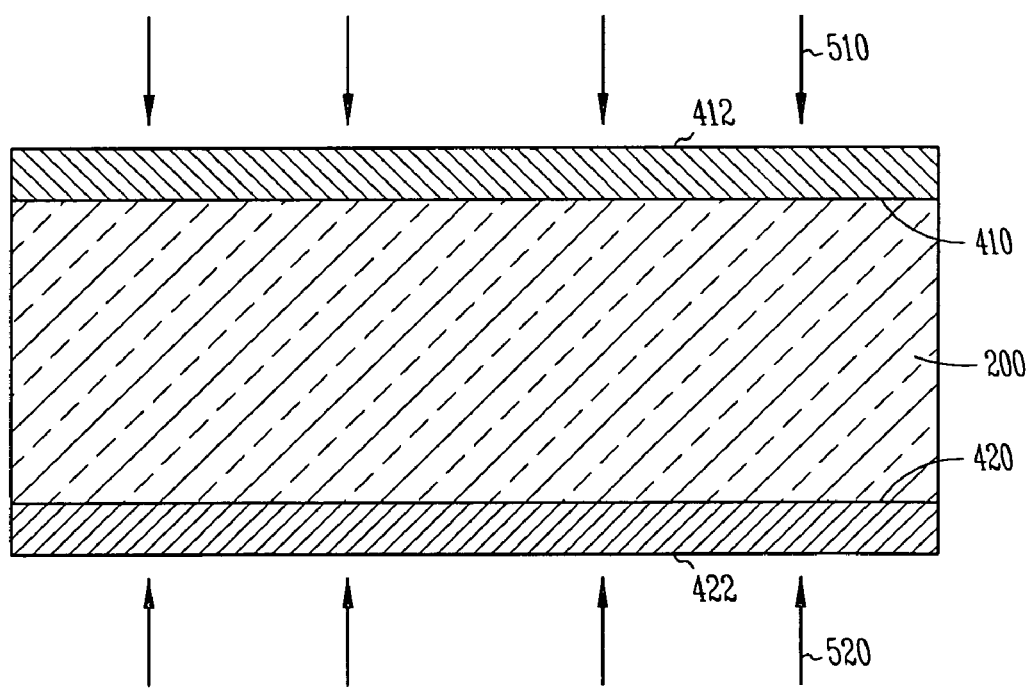
FIG. 5 illustrates a cross-sectional view of a substrate with thinned copper foil, according to an example embodiment.

FIG. 5 illustrates a cross-sectional view of the substrate 200, according to an example embodiment. As shown FIG. 5, the layer of copper foil 412 is thinned by etching as depicted by the arrows 510. Similarly the layer of copper foil 422 is thinned by etching as depicted by the arrows 520. It should be noted that the etching of the layer of copper foil 412 and the etching of the layer of copper 422 may not be done simultaneously. For example, one of the layers, such as copper foil layer 412 may be initially etched and then the substrate 200 is flipped and the other copper layer on the second major surface of 420 is etched, in one example embodiment. And another example embodiment each layer 412, 422 of copper foil may be etched as depicted by the arrows 510, 520, respectively at the same time. The effect of etching the copper foil layers 412, 422 is that the copper foil layers 412, 422 are thinned to a desired thickness.

Figure 6:
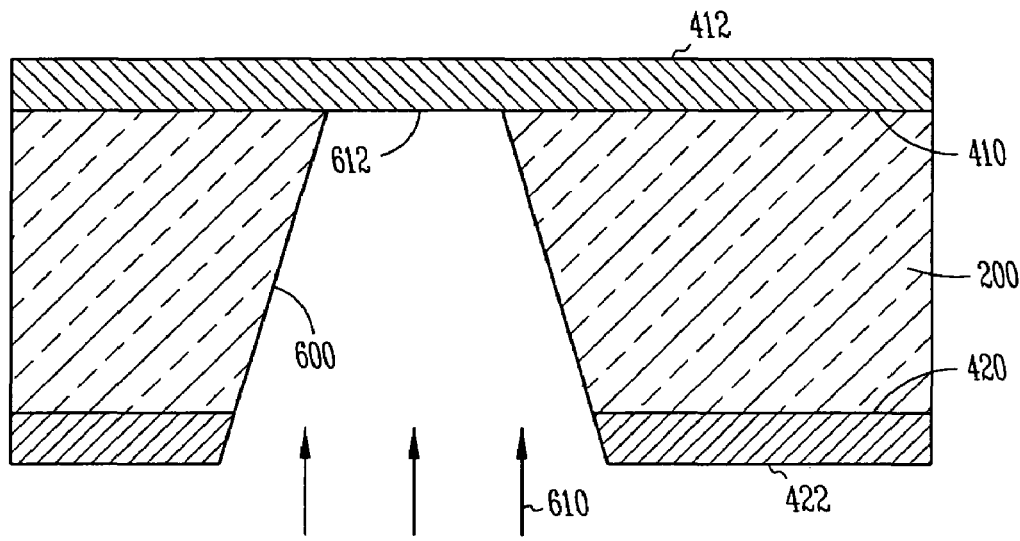
FIG. 6 illustrates a cross-sectional view of a substrate with an opening formed in the package attach side of the substrate, according to an example embodiment.

FIG. 6 illustrates a cross-sectional view of a substrate 200 with an opening 600 being formed in the substrate 200, according to an example embodiment. The opening 600 is formed by a direct laser drilling process as depicted by arrows 610. The opening 600 is in the second major surface of 420 which will eventually become the major surface of the substrate 200 of the finished package that will attach to the printed circuit board 100 (see FIG. 1). Therefore, the second major surface 420 may also be termed as the package attached side of the substrate 200. The opening 600 may also be termed as being in the back side of the substrate 200. The opening 600 has a closed end or terminal end that includes the copper foil layer 412 positioned on the first major surface 410 of the substrate 200. The opening 600 passes through substantially the entire substrate 200 and terminates at the copper foil layer 412 on the first major surface 410 of the substrate 200. The opening also passes through the copper foil layer 422 attached to the second major surface 420 of the substrate 200.

Figure 7:
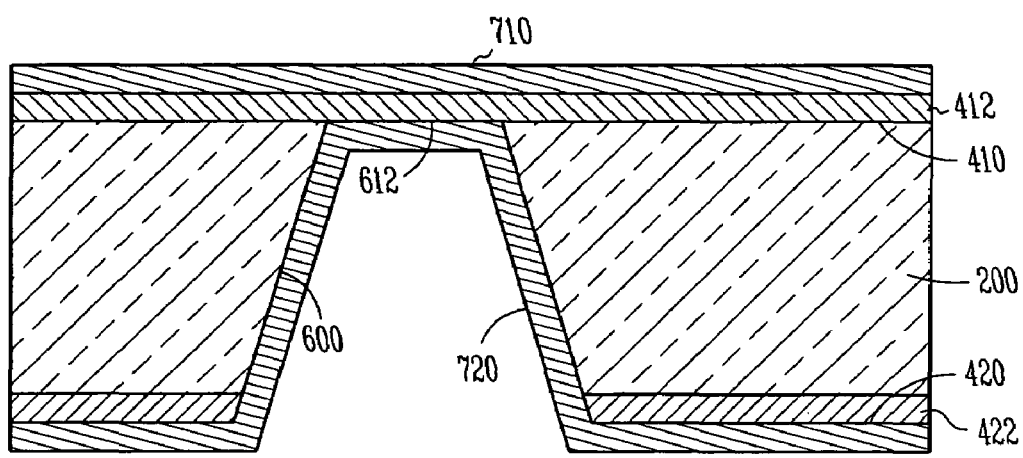
FIG. 7 illustrates a cross-sectional view of a substrate after electroless copper plating, according to an example embodiment.

FIG. 7 illustrates a cross-sectional view of a substrate 200 after an electroless copper plating, according to an example embodiment. The first major surface 410 which includes copper foil layer 412 is platted with a layer of copper 710. The layer of copper 710 is placed on the copper foil layer 412 using an electroless plating process. Similarly, the second major surface 420 having copper layer 422 thereon, as well as the opening 600 and the bottom of the opening 612 is provided with a copper layer 720. The copper layer 720 is placed over the copper foil layer 422 and within the opening 600 using an electroless plating process.

Figure 8:
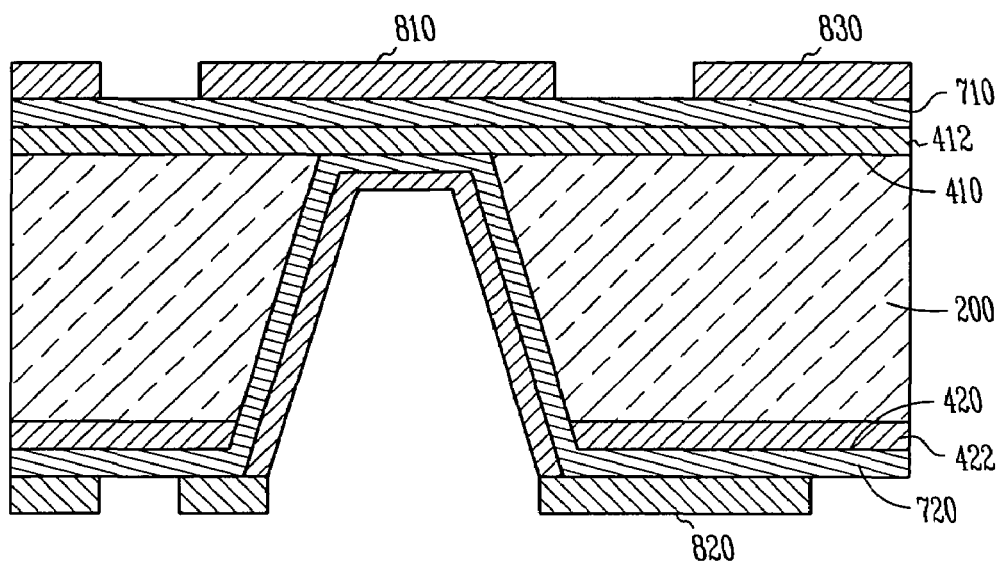
FIG. 8 illustrates a cross-sectional view of a substrate after electrolytic plating of copper, according to an example embodiment.

FIG. 8 illustrates a cross-sectional view of a substrate after electrolytic plating of copper, according to an example embodiment. Although not shown, a layer of photo resist is placed on the layer of copper 710 associated with the first major surface 410 and on the second main surface 420 associated with the second major surface 420 of the substrate 200. The photo resist is exposed. Depending upon whether the photo resist is positive or negative, portions of the photo resist are removed. The substrate 200 is then placed in to a solution of copper where electrolytic copper plating takes place resulting in the features shown on layer of copper 710 and the features shown on copper layer 720. The features on layer of copper 710 include a flip chip pad 810 and wire bond pad 830. As mentioned previously, several features are also formed on the second major surface 420 of the substrate 200. The features include a ball pad 820.

Figure 9:
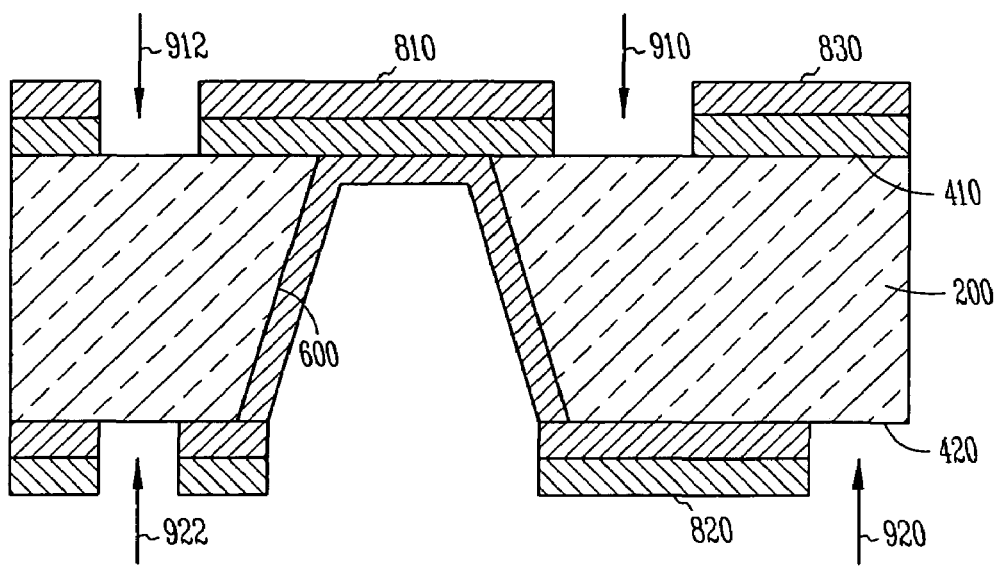
FIG. 9 illustrates a cross-sectional view of a substrate after selectively etching to the core, according to an example embodiment.

FIG. 9 illustrates a cross-sectional view of the substrate 200 after selectively etching to the core of the substrate 200 according to an example embodiment. The selective etching is accomplished by masking certain features of the first major surface 410 and the features on the second major surface 420. In another example embodiment, a quick etch is done without masking portions of the copper surface 810 and 820. A wet or dry etch is then used to remove portions of the copper foil layer 412 and the layer of copper 710, as depicted by arrows having the reference numbers 910, and 912. The etch depicted by the arrows 910, and 912, can be either a wet or a dry etch. The etch electrically isolates certain of the features from other of the features, for example on the first major surface 410 of the substrate 200, the etch depicted by arrow 910, electrically isolates the flip chip pad 810 from the wire bond pad 830 by removing the copper between flip chip pad 810 and the arrows 910. Similarly, the features associated with second major surface 420 are masked and then portions of the major surface are etched as depicted by arrows 920, 922. The etch depicted by arrows 920, 922, can be either a wet or dry etch. The etch depicted by arrows 920, 922 removes the copper near certain features, thereby electrically isolating certain features from other features. In other words, all the etches, depicted by arrows having the reference numerals 910, 912, 920, 922, remove copper and continue until the substrate 200, which is typically an insulating material or a semi-conductive material that acts as an insulator, is exposed. Once the dry etch operation or operations are complete, the mask material is removed leaving the electrically isolated flip chip pad 810 and the electrically isolated wire bond 830 on the first major surface 410 of the substrate 200. The lined opening 600 provides an electrical path between the flip chip pad 810 and the ball pad 820 associated with the second major surface 420 of the substrate 200. The result of the etching operations, depicted by arrows having the reference numerals 920, 922, electrically isolate the ball pad 820 and the opening in the copper lined opening 600 from other features on the second major surface 420 of the substrate 200.

Figure 10:
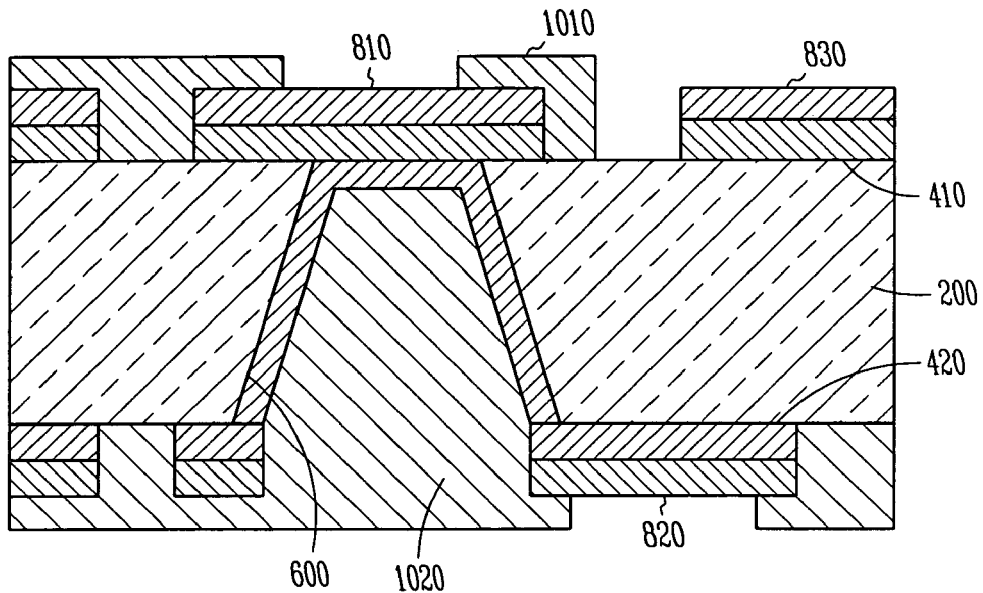
FIG. 10 illustrates a cross-sectional view of a substrate with after deposition of solder resist, according to an example embodiment.

FIG. 10 illustrates a cross-sectional view of the substrate 200 after deposition of solder resist layer 1010, according to an example embodiment associated with first major surface 410 of the second main substrate 220 and a solder resist layer 1020 associated with the second major surface 420 of the substrate 200. The solder resist layers 1010 and 1020, are placed on the first major surface 410 and on the second major surface 420 of the substrate 200 by a printing operation, and one example embodiment. The solder resist layers 1010 and 1020 are patterns so as to cover certain features and leave exposed the flip chip pad 810, the ball pad 820 and the wire bond pad 830. The solder resist layer fills the opening 600 and covers certain features associated with the second major surface 420 of the substrate 200. In an alternative embodiment, solder resist material may be placed over the entire first major surface 410 and the second major surface 420. A layer of photo resist may be placed atop the solder resist material. The photo resist is exposed and portions of the solder resist material are removed so that a wet or dry etch may be used to remove undesired portions of the solder resist material.

Figure 11:
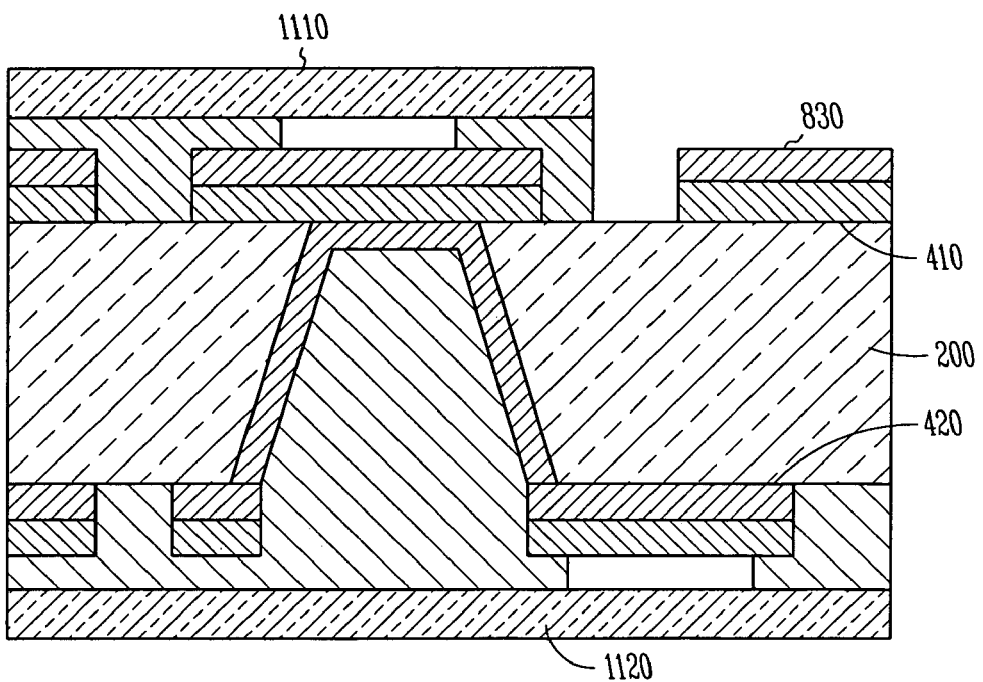
FIG. 11 illustrates a cross-sectional view of a substrate with a dry film mask, according to an example embodiment.

FIG. 11 illustrates a cross-sectional view of the substrate 200 with a dry film mask, according to an example embodiment of the invention. The dry film mask includes a first dry film mask 1110 associated with the first major surface 410 of the substrate 200 and a second dry mask layer 1120 associated with the second major surface 420 of the substrate 200. The first dry film mask 1110 masks or covers all the features with the exception of the wire bond pad 830. The second dry mask layer 1120 masks all of the features associated with the second major surface 420 of the substrate 200, in the example embodiment shown.

Figure 12:
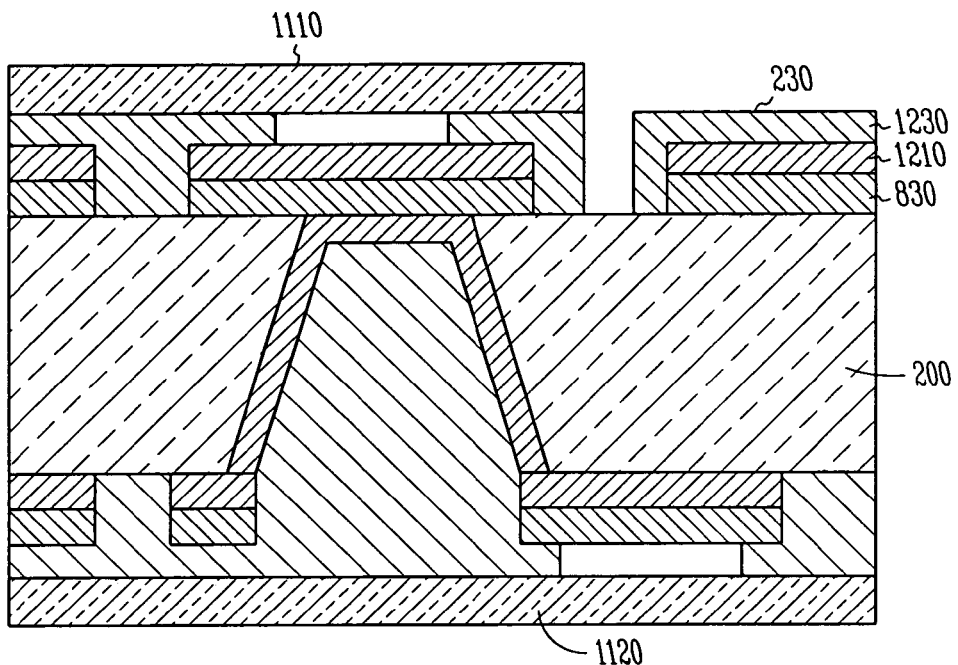
FIG. 12 illustrates a cross-sectional view of a substrate with a dry film mask and after electrolytic plating of a wire bond pad site, according to an example embodiment.

FIG. 12 illustrates a cross-sectional view of the substrate 200 with the first dry film mask 1110, and second dry mask layer 1120 in place and after electrolytic plating of a wire bond pad 830, according to an example embodiment. The entire assembly may be placed into baths in order to accomplish the electrolytic plating of the wire bond pad 830. Initially the entire assembly is placed into a bath of nickel to produce a layer of nickel plating 1210 on the wire bond pad 830. Next, the entire assembly is placed into a bath including ions of gold to accomplish the electrolytic plating the layer of gold 1230 onto the wire bond pad 830. In other embodiments of the invention only a portion of the substrate 200 is placed into the various baths. This is especially effective if wire bond pads, such as wire bond pad 830, are on the perimeter of the substrate 200. As a result of electrolytic plating the layer of gold 1230 and the nickel plating 1210 onto the wire bond pad 830. The finished wire bond pad 230 is formed. (See also FIG. 2) Therefore, a wire bond pad which has a relatively thick layer of gold and nickel on the bond pad site or wire bond pad site 830 is formed on the substrate 200. After electrolytic plating the layer of nickel 1210 and the layer of gold 1230, the first dry film mask 1110 and the second dry film layer 1120 are removed.

Figure 13:
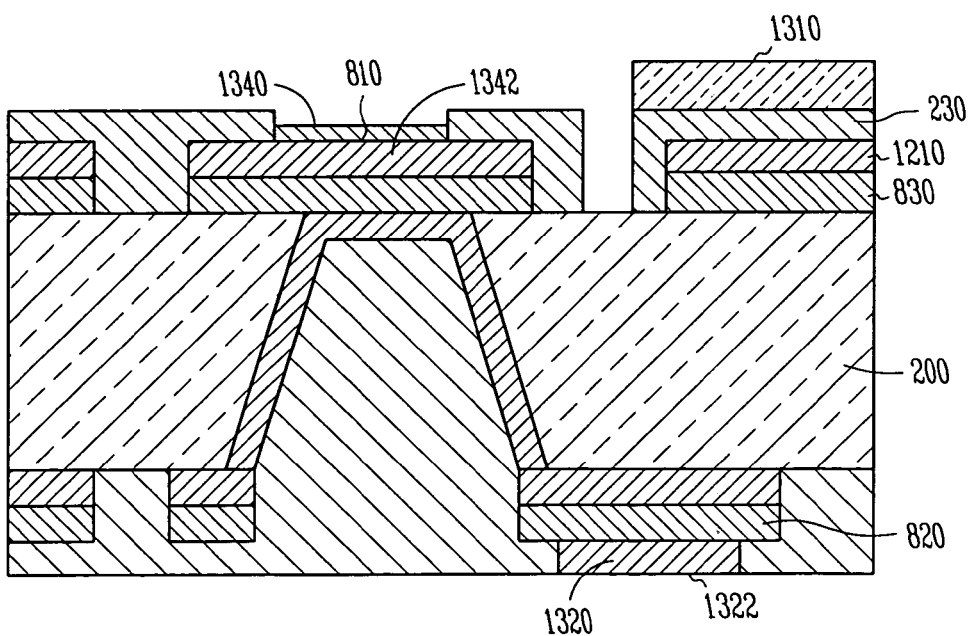
FIG. 13 illustrates a cross-sectional view of a substrate with a dry film mask over a wire bond site, according to an example embodiment

FIG. 13 illustrates a cross-sectional view of the substrate 200 with a dry film mask 1310 placed over the finished wire bond site 230 according to an example embodiment. This leaves the flip chip pad 810 and the ball pad 820 exposed. An electroless layer of nickel is plated onto the flip chip pad and onto the ball pad 820. The nickel is placed by a electroless plating. The end result is a much thinner layer of nickel than the nickel plating 1210 on the wire bond pad 830. As a result of the electroless plating of the nickel, there is a thin layer of nickel 1320 placed upon the ball pad 820 and a thin layer 1340 placed on the flip chip pad 810. Next, electroless gold is plated on to the thin layer 1340 and layer of nickel 1320 associated with the ball pad 820 and the flip chip pad 810. The end result is a thin layer of gold 1322 placed on the layer of nickel 1320 on the ball pad 820 and a thin layer of gold 1342 placed on the thin layer of nickel 1340 on the ball pad 820. The end result is the ball pad 820 with the layer of nickel 1320 and the layer of gold produces the ball bond finished pad 240 (shown in FIG. 2), and the electroless, plated layer of nickel 1340 and the electroless, plated layer of gold 1340 to on the flip chip pad 810 results in the ball bond pad 240 (shown in FIG. 2). The dry film mask layer 1310 is removed to produce the finished substrate 200 having a wire bond pad with relatively thick layers of nickel and gold attached thereto. The relatively thick layers of nickel 1210 and layer of gold 1230 are formed by the electrolytic plating and are thick enough so that a wire may be bonded to the wire bond pad 230. Associated with the same surface is another pad or the flip chip pad which is capable of receiving a ball from one of the die. The ball bond pad 240 also includes layers of nickel and gold 1340, 1342 which are thinner than the layers of gold associated with the finished pad 230. The layer of gold 1342 and the thin layer of nickel 1340 are thin enough so as not to migrate into the solder ball of the die which will attach to the ball bond pad 240, thereby causing embrittlement of the joint between the solder ball, such an array of balls 322 and the ball bond pad 240. Similarly, the layers of nickel 1320 and gold 1322 associated with the ball bond pad 240, allow a solder ball to be formed on the ball bond pad 240 without causing embrittlement at the juncture between the substrate, specifically the ball bond pad 240 and the resultant solder ball.

Figure 14:
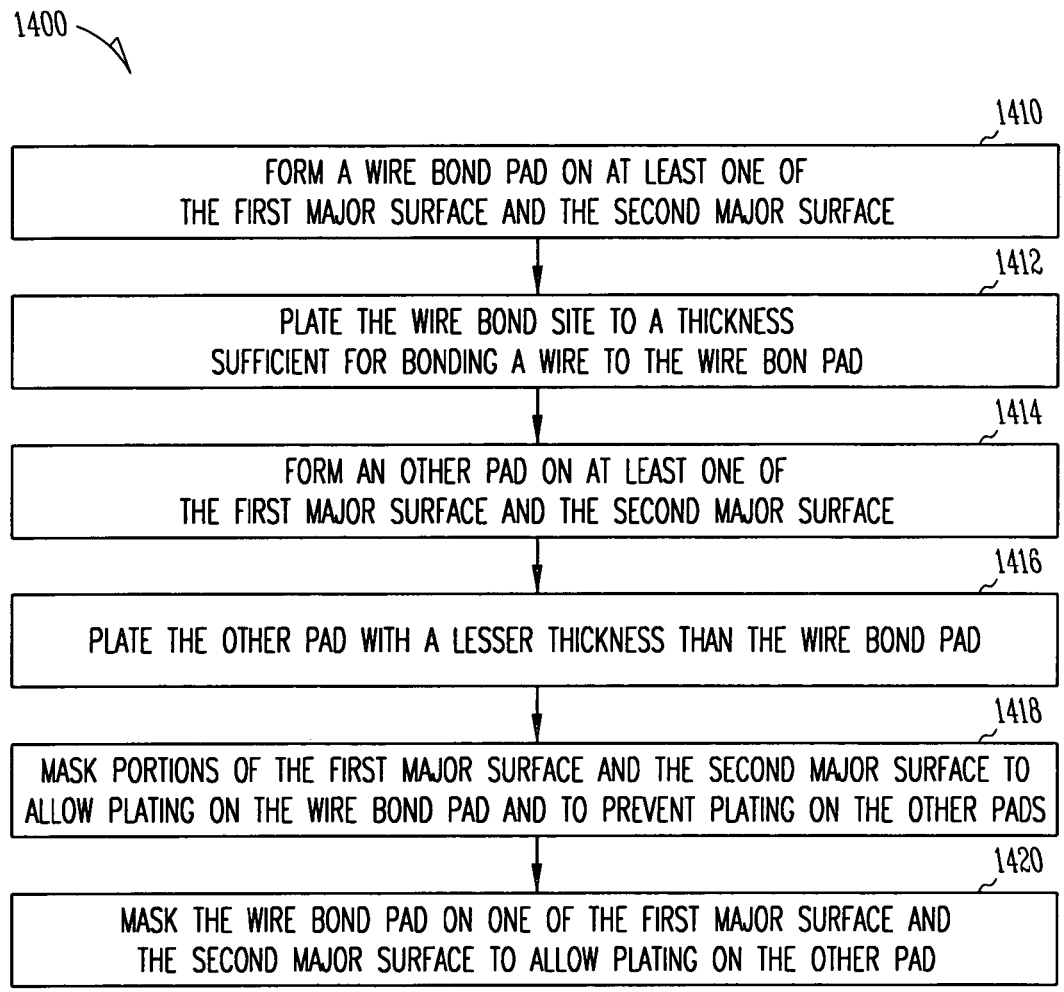
FIG. 14 is a flow chart of a method of forming the substrate, according to an example embodiment.

FIG. 14 is a flow chart of a method 1400 of forming the substrate, according to an example embodiment. The method 1400 for plating a substrate having a first major surface and a second major surface includes forming a wire bond pad on at least one of the first major surface and the second major surface 1410, and plating the wire bond site to a thickness sufficient for bonding a wire to the wire bond pad 1412. The method also includes forming an other pad on at least one of the first major surface and the second major surface 1414, and plating the other pad with a lesser thickness than the wire bond pad 1416, the other pad having a thickness sufficient to receive a ball from a ball grid array device. The method 1400 further includes masking portions of the first major surface and the second major surface to allow plating on the wire bond pad and to prevent plating on the other pads 1418. In some embodiments, the plating on the wire bond pad 1412 is electrolytic plating and includes placing the wire bond pad in an electrolytic solution. In still other embodiments, the method of plating on the wire bond pad 1412 includes plating a layer of nickel in a first electrolytic solution, and plating a layer of gold in a second electrolytic solution. The method 1400 also includes masking the wire bond pad on one of the first major surface and the second major surface to allow plating on the other pad on one of the first major surface and the second major surface 1420. In some embodiments, the plating the other pad 1418 is electroless plating. In other embodiments plating the other pad 1418 further includes an electroless plating of nickel, and an electroless plating of gold.

Figure 15:
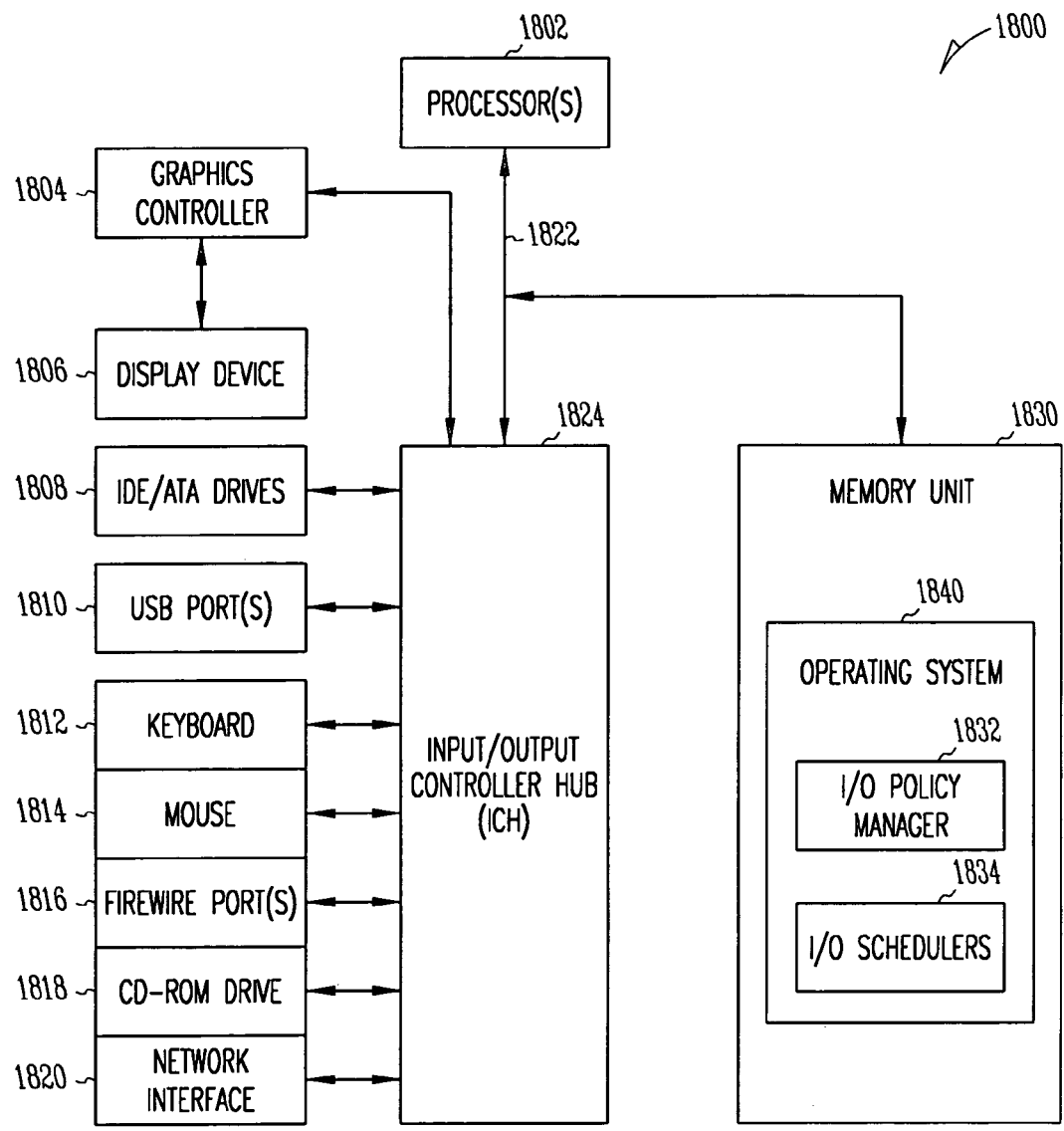
FIG. 15 illustrates an example computer system used in conjunction with certain example embodiments of the invention.

FIG. 15 illustrates an example computer system used in conjunction with certain embodiments of the invention. As illustrated in FIG. 18, computer system 1800 comprises processor(s) 1802. The computer system 1800 also includes a memory unit 1830, processor bus 1822, and Input/Output controller hub (ICH) 1824. The processor(s) 1802, memory unit 1830, and ICH 1824 are coupled to the processor bus 1822. The processor(s) 1802 may comprise any suitable processor architecture. The computer system 1800 may comprise one, two, three, or more processors, any of which may execute a set of instructions.

The memory unit 1830 includes an operating system 1840, which includes an I/O scheduling policy manager 1832 and I/O schedulers 1834. The memory unit 1830 stores data and/or instructions, and may comprise any suitable memory, such as a dynamic random access memory (DRAM), or FLASH memory, for example. The computer system 1800 also includes IDE drive(s) 1808 and/or other suitable storage devices. A graphics controller 1804 controls the display of information on a display device 1806, according to embodiments of the invention.

The Input/Output controller hub (ICH) 1824 provides an interface to I/O devices or peripheral components for the computer system 1800. The ICH 1824 may comprise any suitable interface controller to provide for any suitable communication link to the processor(s) 1802, memory unit 1830 and/or to any suitable device or component in communication with the ICH 1824. For one embodiment of the invention, the ICH 1824 provides suitable arbitration and buffering for each interface.

For one embodiment of the invention, the ICH 1824 provides an interface to one or more suitable integrated drive electronics (IDE) drives 1808, such as a hard disk drive (HDD) or compact disc read-only memory (CD ROM) drive, or to suitable universal serial bus (USB) devices through one or more USB ports 1810. For one embodiment, the ICH 1824 also provides an interface to a keyboard 1812, a mouse 1814, a CD-ROM drive 1818, and one or more suitable devices through one or more firewire ports 1816. The ICH 1824 also provides a network interface 1820 though which the computer system 1800 can communicate with other computers and/or devices on a computer network 1840. The network interface couples the network 1840 to the computer system 1800 via a link 1842. The link 1842 can include a hard wire coupling or a wireless, or both. The computer system 1800 can be any type of computer such as a desktop, server or hand-held device coupled to any type of computer network. One use of the example embodiments described above is for FLASH memory in a hand-held device, such as a personal data assistant or cell phone, for use in a cellular network. FLASH memory is a type of EEPROM (electrically erasable programmable read-only memory) in which data or information can be written or erased in blocks of data. Other uses of the example embodiments includes as a chip set for a computer system 1800, or as chip level packaging, The circuit board 100 (see FIG. 1)

can be a printed circuit board or the like and can include substantially all of the computer system 1800 or parts of the computer system.

In one embodiment, the computer system 1800 includes a machine-readable medium that stores a set of instructions (e.g., software) for controlling the computer system 1800 and sending or receiving information to or from the network 1840. The set of instructions (software) can reside, completely or at least partially, within memory unit 1830 and/or within the processor(s) 1802.

Thus, a system, method, and machine-readable medium including instructions for Input/Output scheduling have been described. Although the present invention has been described with reference to specific example embodiments, it will be evident that various modifications and changes may be made to these embodiments without departing from the broader spirit and scope of the disclosed subject matter. Accordingly, the specification and drawings are to be regarded in an illustrative rather than a restrictive sense.

It is to be understood that the phraseology or terminology employed herein is for the purpose of description and not of limitation. Accordingly, the embodiments of the invention are intended to embrace all such alternatives, modifications, equivalents and variations as fall within the spirit and broad scope of the appended claims.

What is claimed is:

1. An electronic system comprising:
   a circuit board; and
   an electronic device coupled to the circuit board, the electronic device comprising:
   a first die that includes wires for bonding;
   a second die that includes an array of balls for bonding; and
   a substrate comprising:
   wire bond sites for wires from the first die; and
   ball bond sites for the array of balls from the second die, wherein the wire bond sites differ from the ball bond sites, the wires of first die coupled to the wire bond sites, and the array of balls of the second die coupled to the ball bond sites of the substrate, wherein the first die includes a FLASH memory, wherein
   the wire bond sites have a first layer of nickel and gold with a first thickness; and
   the ball bond sites have a second layer of nickel and gold with a second thickness, the first thickness greater than the second thickness.

2. An electronic system comprising:
   a circuit board; and
   an electronic device coupled to the circuit board, the electronic device comprising:
   a first die that includes wires for bonding;
   a second die that includes an array of balls for bonding; and
   a substrate comprising:
   wire bond sites for wires from the first die, the wire bond sites including:
   a layer of nickel; and
   a layer of gold; and
   ball bond sites for the array of balls from the second die,
   the ball bond sites further including:
   a layer of nickel; and
   a layer of gold, wherein the wire bond sites differ from the ball bond sites since the layer of nickel and the layer of gold associated with the wire bond sites are thicker than the layer of nickel and the layer of gold associated with the ball bond sites, the wires of first die coupled to the wire bond sites, and the array of balls of the second die coupled to the ball bond sites of the substrate, wherein the first die includes a FLASH memory, wherein the second die is positioned closer to the substrate than the first die within the electronic device.

3. The electronic system of claim 2 further comprising an electronic component attached to the circuit board.

4. The electronic system of claim 2 wherein the circuit board is a printed circuit board.

5. The electronic system of claim 2 wherein the first die is stacked on the second die within the electronic device.

6. The electronic system of claim 2 wherein the second die of the electronic device is a flip chip ball grid array.

7. The electronic system of claim 2 wherein the first die of the electronic device is a plastic ball grid array.

8. The electronic system of claim 2 wherein the electronic device further comprises an encapsulating compound substantially surrounding the first die and the second die.

9. An electronic device comprising:
   a first die that includes wires for bonding;
   a second die that includes an array of balls for bonding;
   a substrate comprising:
   a first major surface;
   a second major surface;
   wire bond sites for wires from the first die; and
   ball bond sites for the array of balls from the second die, the wires of first die coupled to the wire bond sites, and the array of balls of the second die coupled to the ball bond sites of the substrate, wherein the wire bond sites differ from the ball bond sites,
   wherein at least one of the wire bond sites includes a wire bond pad adapted to receive a wire, the wire bond pad associated with at least one of the first major surface and the second major surface; and
   wherein at least one of the ball bond sites includes a ball pad adapted to receive a ball, the ball pad associated with the same of the at least one of the first major surface and the second major surface as the wire bond pad, wherein at least one of the ball bond sites includes:
   a layer of nickel; and
   a layer of gold, wherein the at least one wire bond pad includes a plated area having plating thickness sufficient for receiving a wire, wherein the at least one ball pad includes a plated area having a plating thickness less than the plating thickness of the wire bond pad.

10. The electronic device of claim 9 wherein the at least one ball bond pad includes a layer of nickel that is thinner than a layer of nickel on the wire bond site.

11. The electronic device of claim 9 wherein the at least one ball bond pad includes a layer of gold that is thinner than a layer of gold on the wire bond site.

12. The electronic device of claim 9 wherein the substrate is formed by a method comprising:
   plating the at least one wire bond pad to a thickness sufficient for bonding a wire to the wire bond pad; and
   plating the at least one ball pad with a lesser thickness than the wire bond pad, the further pad having a thickness sufficient to receive a ball from a ball grid array device.

13. The electronic device of claim 12 wherein the method further comprises masking portions of the at least one of the first major surface and the second major surface to allow plating on the wire bond pad and to prevent plating on the ball pad.

14. The electronic device of claim 13 wherein the plating on the at least one wire bond pad is electrolytic plating.

15. The electronic device of claim 13 wherein plating the at least one wire bond pad includes placing the wire bond pad in an electrolytic solution.

16. The electronic device of claim 13 wherein plating the at least one wire bond pad includes:
   plating a layer of nickel from a first electrolytic solution; and
   plating a layer of gold from a second electrolytic solution.

17. The electronic device of claim 13 wherein the method further comprises masking the at least one wire bond pad on the at least one of the first major surface and the second major surface to allow plating on the ball pad.

18. The electronic device of claim 17 wherein the plating the at least one ball pad includes electroless plating.

19. The electronic device of claim 17 wherein plating the at least one ball pad includes:
   an electroless plating of nickel; and
   an electroless plating of gold.

20. An electronic device comprising:
   a first die that includes wires for bonding;
   a second die that includes an array of balls for bonding;
   a substrate comprising:
      wire bond sites for wires from the first die, the wire bond site further comprising:
         a first layer of nickel; and
         a second layer of gold; and
      ball bond sites for the array of balls from the second die, the ball bond site further comprising:
         a third layer of nickel substantially thinner than the first layer of nickel; and
         a fourth layer of gold substantially thinner than the second layer of gold, the wires of first die coupled to the wire bond sites, and the array of balls of the second die coupled to the ball bond sites of the substrate, wherein the wire bond sites differ from the ball bond sites, wherein
      the wire bond sites have a first plating with a first thickness; and
      the ball bond sites have a second plating with a second thickness, the first thickness greater than the second thickness.

21. The electronic device of claim 20 wherein the first die is stacked on the second die.

* * * * *